United States Patent
Ng et al.

(10) Patent No.: US 7,843,673 B2
(45) Date of Patent: Nov. 30, 2010

(54) ANTENNA DIODES WITH ELECTRICAL OVERSTRESS (EOS) PROTECTION

(75) Inventors: Kian Ann Ng, Singapore (SG); Weng Hong Lai, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 669 days.

(21) Appl. No.: 11/860,548

(22) Filed: Sep. 25, 2007

(65) Prior Publication Data

US 2009/0080132 A1    Mar. 26, 2009

(51) Int. Cl.
   *H02H 9/00*    (2006.01)
(52) U.S. Cl. .......................................... 361/56
(58) Field of Classification Search .................... 361/56
   See application file for complete search history.

(56) References Cited

U.S. PATENT DOCUMENTS 6,389,584 B1 *   5/2002   Kitahara ..................... 716/13
6,594,809 B2     7/2003   Wang et al.
6,934,136 B2 *   8/2005   Duvvury .................... 361/56

OTHER PUBLICATIONS

Ming-Dou Ker et al., ESD protection design for mixed-voltage-tolerant I/O buffers with substrate-triggered technique, SOC Conference, 2003. Proceedings. IEEE International [Systems-on-Chip], Volume , Issue , Sep. 17-20, 2003 pp. 219-222.

* cited by examiner

*Primary Examiner*—Stephen W Jackson
(74) *Attorney, Agent, or Firm*—Horizon IP Pte Ltd

(57) ABSTRACT

An antenna diode circuit for discharging static charge accumulated during wafer processing is described. The antenna diode circuit includes first and second junctions coupled to a circuit element and substrate. Between the first and second junctions is a diode circuit path with an antenna diode and at least one diode protection circuit coupled in series. The diode protection circuit reduces or prevents EOS current from flowing through the diode circuit path during an EOS event.

21 Claims, 18 Drawing Sheets

US 7,843,673 B2

ANTENNA DIODES WITH ELECTRICAL OVERSTRESS (EOS) PROTECTION

FIELD OF THE INVENTION

The present invention relates generally to integrated circuits (ICs), and more particularly to antenna diodes.

BACKGROUND OF THE INVENTION

During some semiconductor manufacturing processes, electrical charge can be stored on the wafer. For example, during plasma etching, reactive ions are generated in an ion discharge chamber and accelerated by an electric field. These ions collect on the wafer surface, accumulating in, for example, circuit elements on the substrate such as p-type and n-type doped well. The statically stored charge in the wells can ultimately discharge, potentially damaging the devices. Antenna diodes are used to dissipate the charge stored in the wells to avoid damaging the devices. The stored charge is dissipated to, for example, the substrate.

FIGS. 1a-b show one implementation of a conventional n-well antenna diode 100. Referring to FIG. 1a, a p-type substrate 101 having an n-well 110 is shown. A first terminal 120 is coupled to the n-well using a heavily doped n-type diffusion region 115; a second terminal 125 is coupled to the substrate using a heavily doped p-type diffusion region 105. The first terminal is coupled to a high potential (e.g., $V_{DD}$) while the second terminal is coupled to a low potential (e.g., ground). A diode 140 is coupled between the first and second terminals, with the anode being coupled to the second terminal and the cathode being coupled to the first terminal. The diode 140 can be realized by, for example, forming a heavily doped p-type diffusion region 142 in the n-well and coupling it to the second terminal 125, as shown in FIG. 1b.

Coupled between the first and second terminals is an over-voltage protection circuit 130. The over-voltage protection circuit serves to suppress EOS, such as electrostatic discharge (ESD) from damaging the IC. FIG. 1c shows an ESD current path 151. In normal operation, the second terminal is at a lower potential than the first terminal. However, during an EOS event, a spike (e.g., overstress voltage) at the second terminal causes it to have a higher potential than the first terminal. This causes the ESD current to flow from the second terminal to the first terminal through the over-voltage protection circuit.

The invention relates to improved antenna diodes for dissipating statically stored charges in ICs.

SUMMARY OF THE INVENTION

The present invention relates to antenna diodes for discharging static charges accumulated, for example, during processing. The present invention can be applied to any type of IC or device. In one aspect of the invention, it relates to an IC. In another aspect of the invention, it relates to a device. In yet another aspect of the invention, it relates to a circuit. The IC, semiconductor device or circuit comprises an antenna diode circuit path having first and second junctions, the first junction is coupled to a circuit or device element and the second junction is coupled to a substrate, wherein the diode circuit path provides a path for dissipating statically stored charges in the circuit or device element accumulated during processing to the substrate. An antenna diode disposed in the diode circuit path wherein the antenna diode is configured in reverse bias between the circuit or device element and substrate. A diode protection circuit is disposed in the diode circuit path in series with the antenna diode to reduce EOS current flowing through the antenna diode circuit path.

In another aspect of the invention, a method of designing a device is disclosed. The method comprises providing in a device design a diode circuit path having first and second junctions. The first junction is coupled to a device element and the second junction is coupled to a region on a substrate, wherein the diode circuit path provides a path for dissipating statically stored charges in the device element accumulated during processing to form the device. An antenna diode disposed in the diode circuit path is provided wherein the antenna diode is configured in reverse bias between the device element and the region on the substrate. A diode protection circuit disposed in the diode circuit path is provided in series with the antenna diode to reduce EOS current flowing through the antenna diode circuit path during normal operation of the device.

In yet another aspect of the invention, a method for reducing static discharge damage is disclosed. The method comprises providing a substrate with a circuit element. An antenna diode is formed in a diode circuit path between the first and second junctions, wherein the first junction is coupled to the circuit element and the second junction is coupled to the substrate to provide a path to discharge static charge accumulated on the circuit element during processing. At least one diode protection circuit is provided in the diode circuit path in series with the antenna diode to reduce EOS current flowing through the diode circuit path.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the present invention are described with reference to the following drawings, in which.

DETAILED DESCRIPTION OF THE INVENTION

The present invention relates to integrated circuits (ICs). More particularly, the invention relates to antenna diodes for discharging static charges accumulated, for example, during wafer processing such as plasma etching.

Figure 1A:
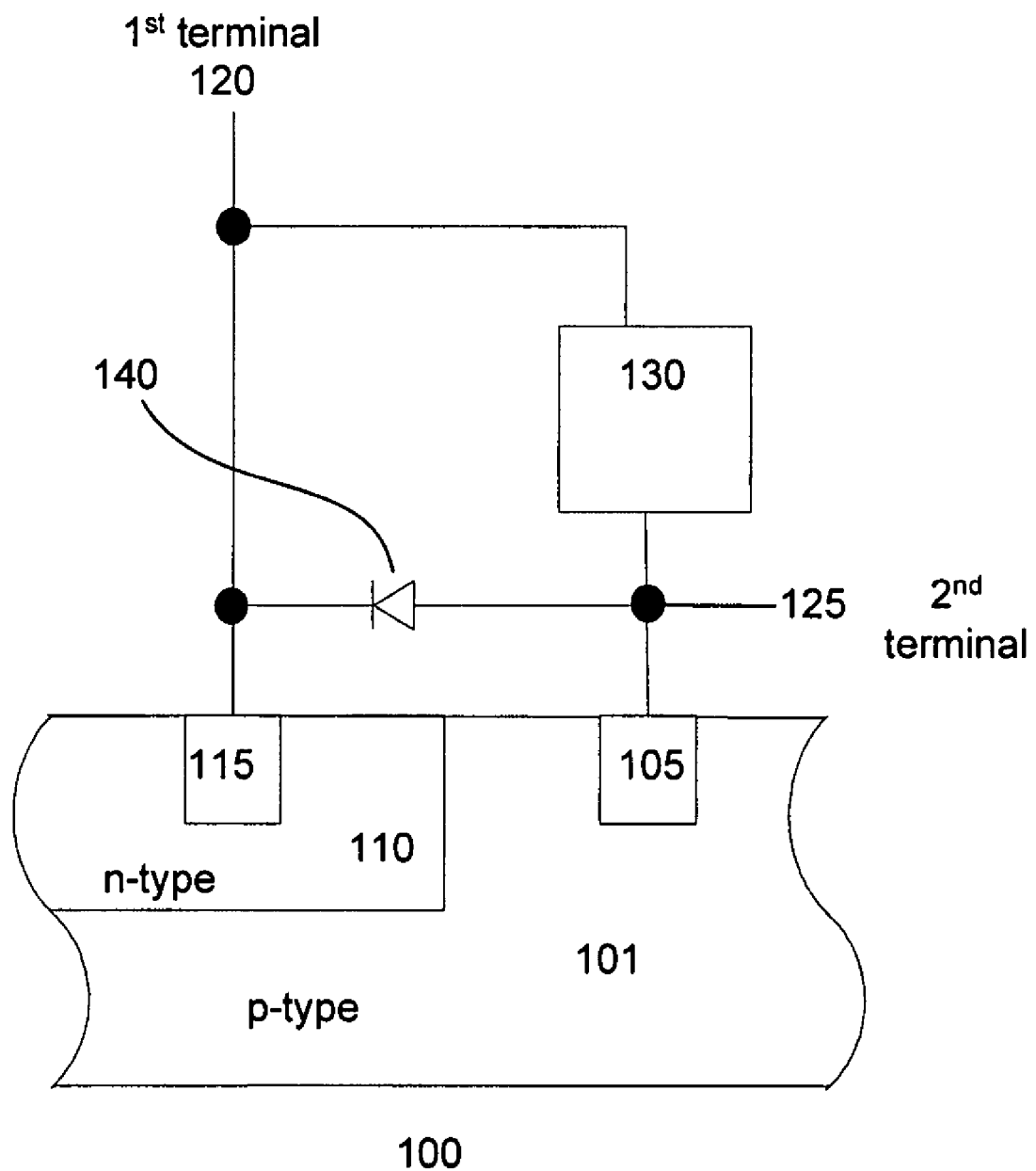
FIGS. 1a-c show a conventional antenna diode.
Figure 1B:
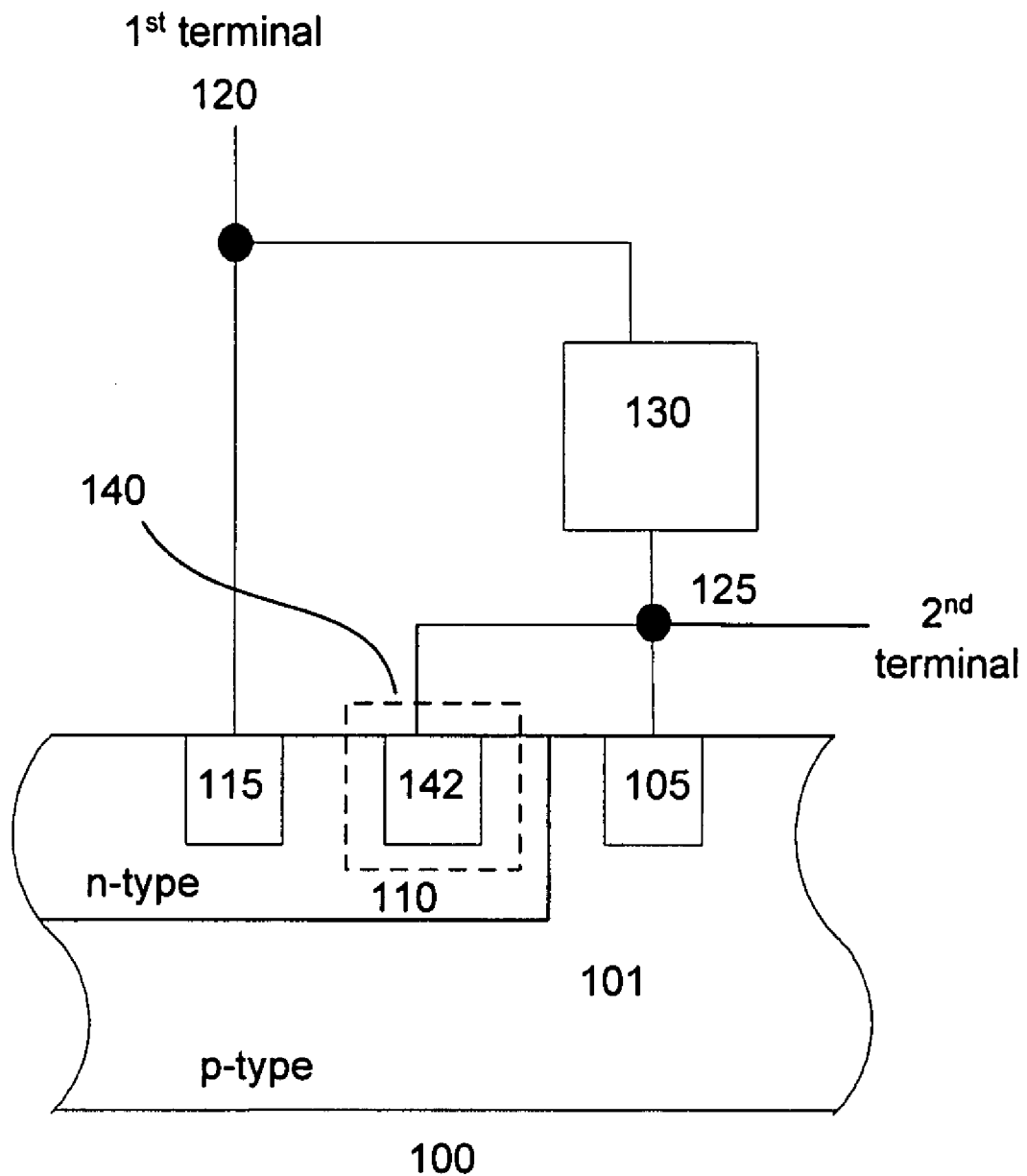
Figure 1C:
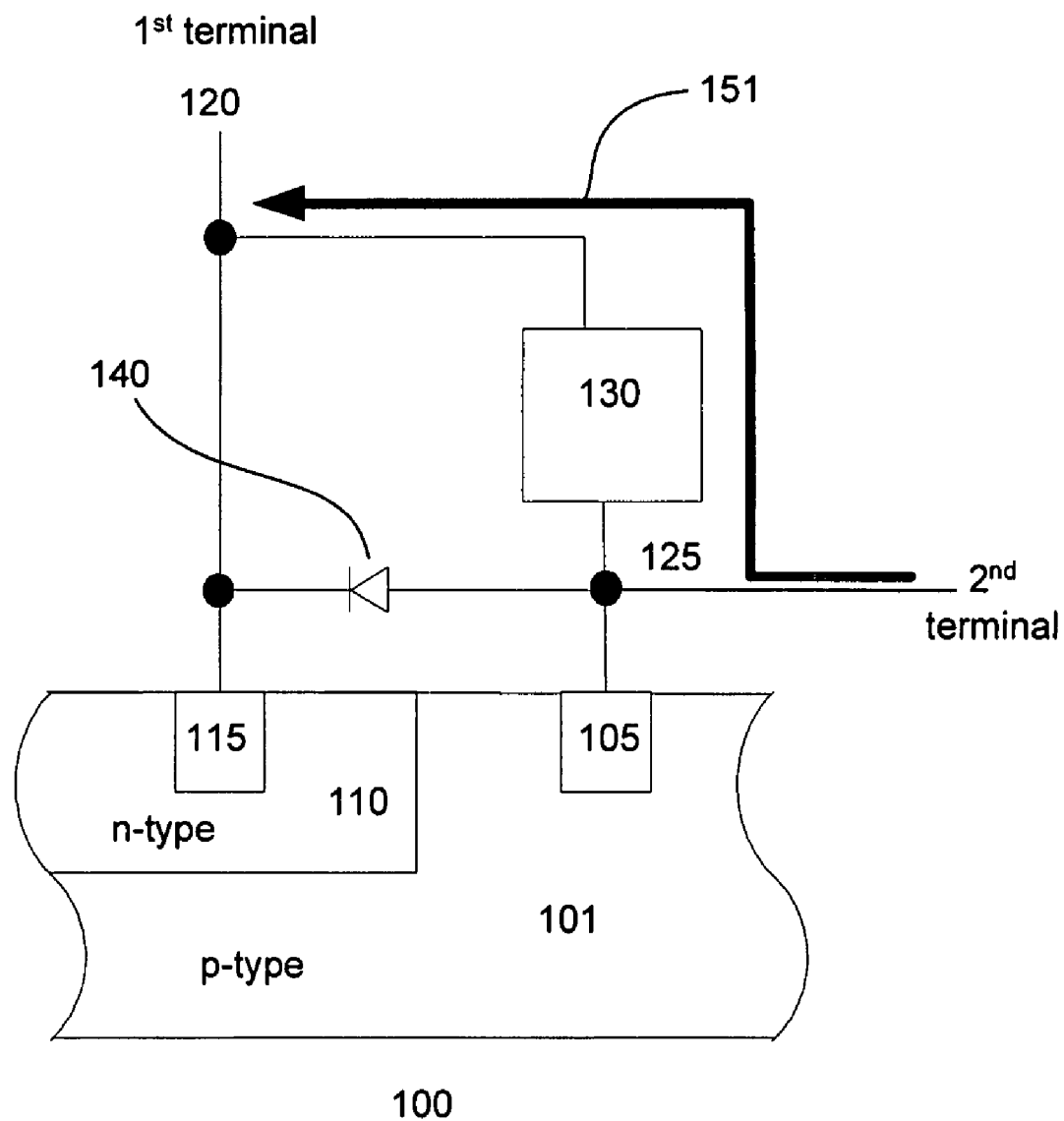
Figure 2A:
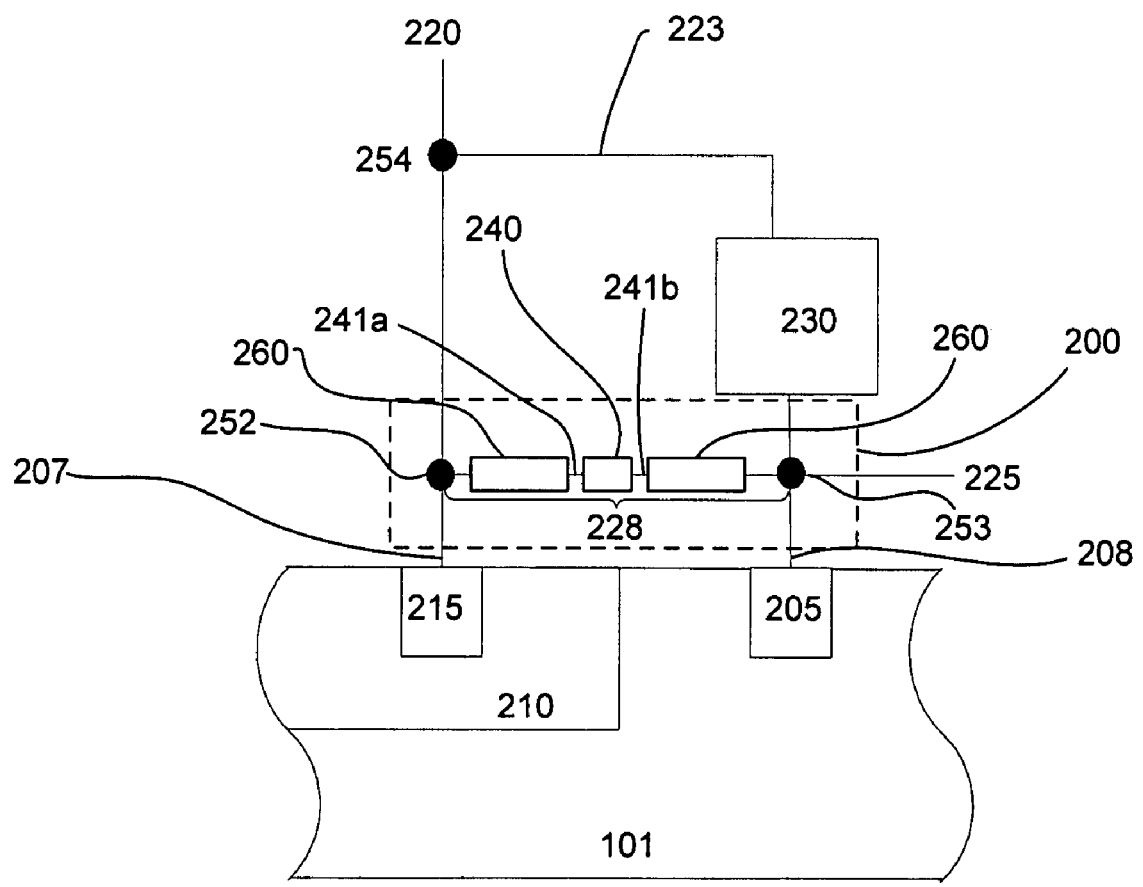
FIGS. 2a-c show antenna diode circuits in accordance with different embodiments of the invention.

FIG. 2a shows a block diagram of an antenna diode circuit 200 in accordance with one embodiment of the invention. The antenna diode circuit can be used in any type of semiconductor device or IC. For example, the antenna diode circuit can be incorporated into memory ICs, processors, analog ICs, mixed signal ICs, or microelectromechanical systems (MEMS). Other types of semiconductor devices or ICs are also useful. The antenna diode circuit comprises first and second junctions 252 and 253 forming a diode circuit path 228. One of the junctions is coupled to a first region 205 on a substrate 101 on which the IC is formed. The substrate, for example, comprises a semiconductor substrate such as silicon. Other types of substrates are also useful. In one embodiment, the substrate comprises a lightly doped substrate with dopants of a second polarity type. In one embodiment, the first region comprises a doped region on the lightly doped substrate, both of which are of the second polarity type. The other junction is coupled to a circuit element. In one embodiment, the circuit element comprises a doped well 210 in the substrate on which a circuit component is formed. The doped well, in one embodiment, comprises dopants of a first polarity type. Providing other types of circuit elements, such as circuit components, is also useful. In an alternative embodiment, the first region on the substrate can comprise a first doped well of a second polarity type disposed in a second doped well of a first polarity type, with the second doped well serving as, for example, the circuit element. The doped wells, for example, are disposed on a substrate of a second polarity type, forming a triple well configuration.

The first polarity type, in one embodiment, comprises n-type and the second polarity type comprises p-type. For example, an n-well can be formed in a lightly doped p-type substrate or a p-well can be disposed within an n-well on a p-type substrate (e.g., triple well configuration). Alternatively, the first polarity comprises p-type dopants and the second polarity comprises n-type dopants. Other configurations of doped well(s) and substrate(s) are also useful.

The first and second junctions are coupled to the substrate via, for example, first and second substrate terminals 207 and 208. The first substrate terminal is coupled to the circuit element. In one embodiment, the first substrate terminal is coupled to the doped well by a heavily doped region 215 of the first polarity type and the second substrate terminal is coupled to the substrate by a heavily doped region 205 of the second polarity type. During wafer processing, the substrate is coupled to ground. Static charge stored in the circuit element from processing can be dissipated through the diode circuit path to the substrate, avoiding potential damage to the IC.

First and second circuit terminals 220 and 225 are provided. The first circuit terminal is coupled to the circuit element and the second circuit terminal 225 is coupled to the substrate. For example, the first circuit terminal is coupled to the circuit element via the first substrate terminal and the second circuit terminal is coupled to the substrate via the second substrate terminal. The first circuit terminal can be coupled to a first potential and the second terminal can be coupled to a second potential. In one embodiment, the first potential comprises a higher potential than the second potential. The first potential can be, for example, a first power rail such as $V_{DD}$ and the second potential can be a second power rail such as ground ($V_{GND}$). Alternatively, the first potential can comprise a lower potential than the second potential. This can be useful for applications in which the first polarity comprises p-type and the second polarity comprises n-type. For example, the first terminal is coupled to a p-well 210 while the second terminal is coupled to an n-type substrate 101. Other configurations of first and second terminals are also useful.

An over-voltage protection circuit 230 is coupled to the first and second circuit terminals. In one embodiment, the over-voltage protection circuit 230 is coupled to the first junction and the first supply terminal via a third junction 254, forming a first circuit path 223. The over-voltage protection circuit comprises, for example, an electrostatic discharge (ESD) clamp circuit. Various conventional ESD clamp circuits can be used. The over-voltage protection circuit shunts EOS/ESD current during an EOS/ESD event to prevent current from flowing through other elements that are connected between terminals 220 and 225 which can include, for example, diode circuit path 228 or well 210.

In one embodiment, an antenna diode 240 is provided in the diode circuit path 228 between the first and second junctions. The antenna diode 240 having first and second diode terminals 241a-b. The antenna diode, for example, comprises a PN junction. Other types of diodes are also useful. The antenna diode is configured in reverse bias such that the diode circuit path is non-conductive (e.g., isolating the well from the substrate) during normal IC operation. However, during processing such as plasma etching which is performed at elevated temperatures, the antenna diode is conductive. This provides a path between the well and substrate for dissipating statically stored charge accumulated in the well to the substrate.

Figure 2B:
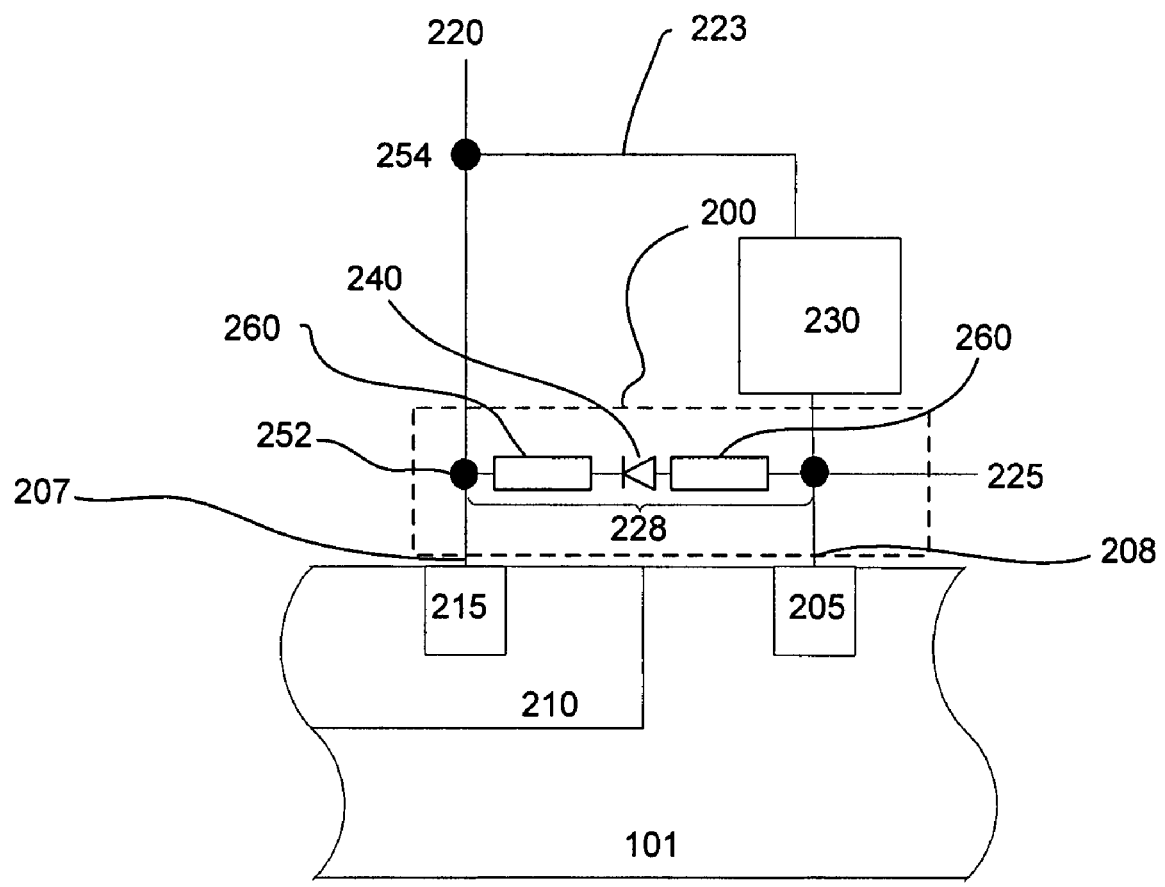

For applications in which the first polarity is n-type and the second polarity is p-type, the first circuit terminal is coupled to a higher voltage potential than the second circuit terminal. In one embodiment, the first circuit terminal is coupled to a more or the most positive potential and the second circuit terminal is coupled to ground or a more or the most negative potential. For example, the first circuit terminal is coupled to $V_{DD}$ and the second circuit terminal is coupled to $V_{GND}$. Other configurations of first and second circuit terminals are also useful. The antenna diode is configured such that the cathode terminal is coupled to the well via the first junction and the anode terminal is coupled to the substrate via the second junction, as shown in FIG. 2b.

Figure 2C:
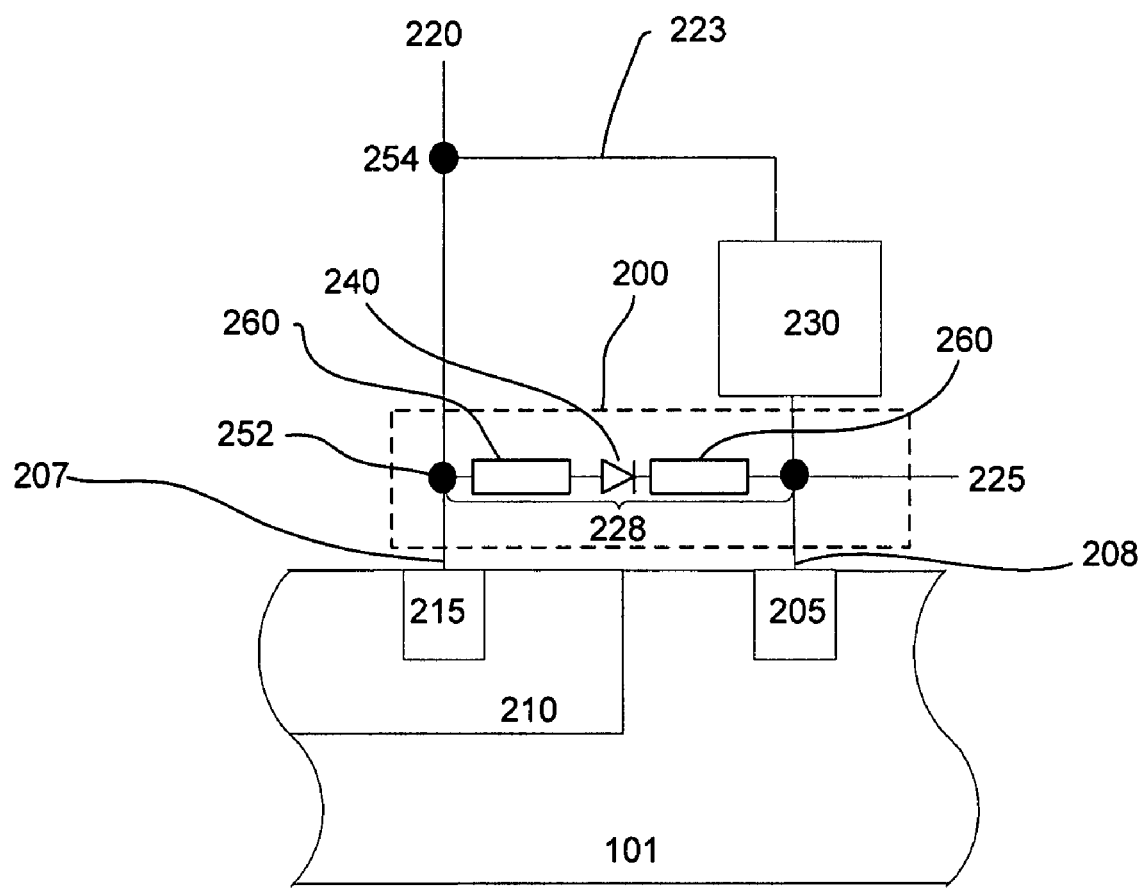

Alternatively, in the case where the first polarity is p-type and the second polarity is n-type, the first circuit terminal is coupled to a lower voltage potential than the second circuit terminal. In one embodiment, the first circuit terminal is coupled to ground or a more or the most negative potential and the second circuit terminal is coupled to a more or the most positive potential. For example, the first circuit terminal is coupled to $V_{GND}$ and the second circuit terminal is coupled to $V_{DD}$. The antenna diode is configured such that the anode terminal is coupled to a p-well 215 via the first junction and the cathode terminal is coupled to an n-substrate 101 via the second junction, as shown in FIG. 2c.

ESD current, for example, a negative ESD zap, flows from a high to low potential. In the case of the application shown in FIG. 2b, ESD current flows from the second circuit terminal to the first circuit terminal. Alternatively, ESD current would flow from the first to the second circuit terminal for the application shown in FIG. 2c. However, we have discovered that a secondary ESD current path exists through the diode circuit path, for example, when the over-voltage protection circuit fails to switch on fast enough. Since the diode is typically small, it can easily be destroyed if the ESD current passing through is sufficiently large, resulting in a short between the terminals which would render the IC defective.

In accordance with one embodiment of the invention, at least one EOS blocking or protection circuit (diode protection circuit) 260 is provided in series with the antenna diode in the diode circuit path. The diode protection circuit 260 comprises, for example, at least one EOS blocking or protection element for reducing or blocking the flow of EOS (e.g., ESD) current through the diode circuit path. Providing a diode protection circuit with a plurality of EOS protection elements is also useful. Preferably, the protection element or elements reduce or block the flow of EOS current through the diode circuit path, for example, during IC operation while allowing charge accumulated in the well to discharge to the substrate during processing. In one embodiment, the EOS protection elements comprise resistors, inductors, diodes or a combination thereof. Other types of EOS protection elements for reducing or blocking EOS current flow are also useful. Preferably, the diode protection circuit comprises at least a diode as an EOS protection element. The use of different or combinations of EOS protection elements increases flexibility to allow designers to optimize the diode protection circuit for different operating frequencies. The diode protection circuit can be coupled either to the first diode terminal, second diode terminal or both. Other series configurations are also useful. Providing at least one diode protection circuit in series with the antenna diode reduces potential damage caused by EOS.

In one embodiment, the impedance Z of the diode protection circuit (e.g., total impedance of all the EOS protection elements) is selected by the following equation:

$$V_{clamp\text{-}triggered} < k[(I_{ESD} * Z) + V_{ant\text{-}diode}]$$

where, $V_{clamp\text{-}triggered}$=trigger voltage to turn on the over-voltage protection circuit k=real number constant $I_{ESD}$=EOS current Z=total impedance of the diode protection circuit $V_{ant\text{-}diode}$=forward voltage of antenna diode The value for "k" is greater than or equal to 1, preferably greater than 2. With this consideration, Z is selected based on known or defined values for $V_{clamp\text{-}triggered}$, $I_{ESD}$ and $V_{ant\text{-}diode}$.

Figure 3A:
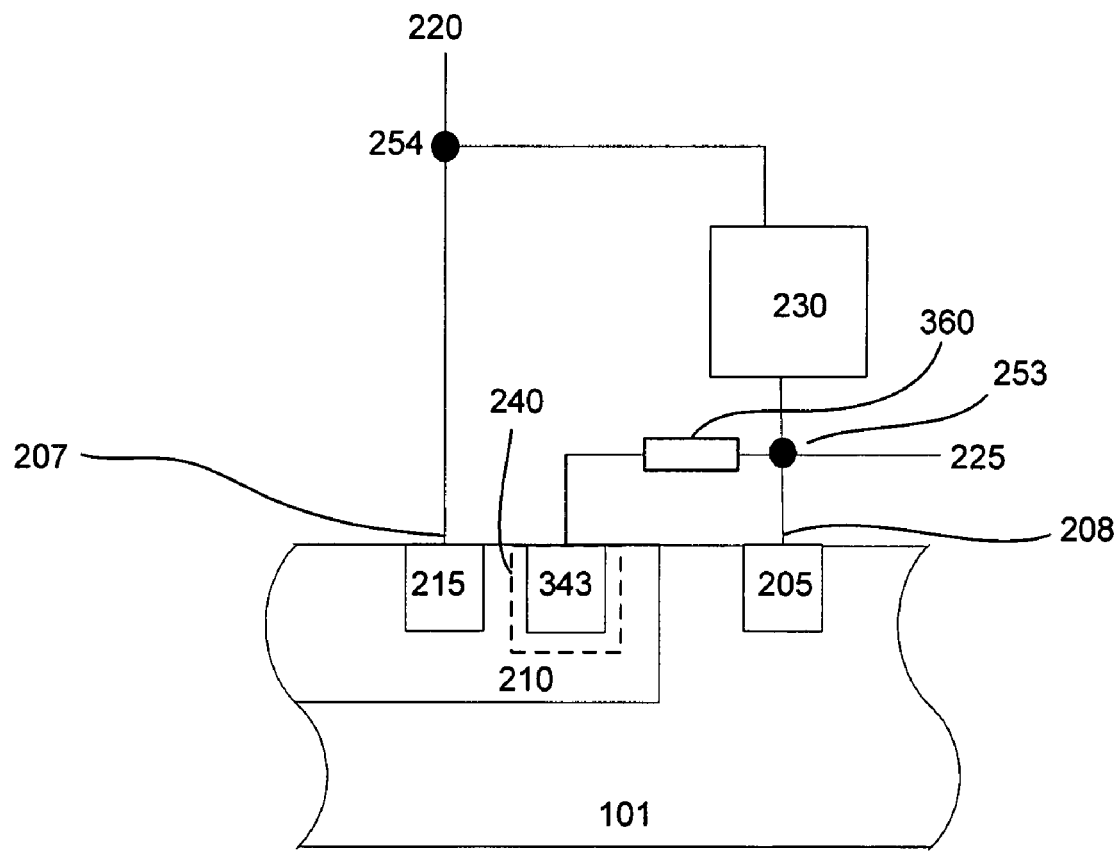
FIGS. 3a-b show implementations of antenna diode circuitry in accordance with various embodiments of the invention.
Figure 3B:
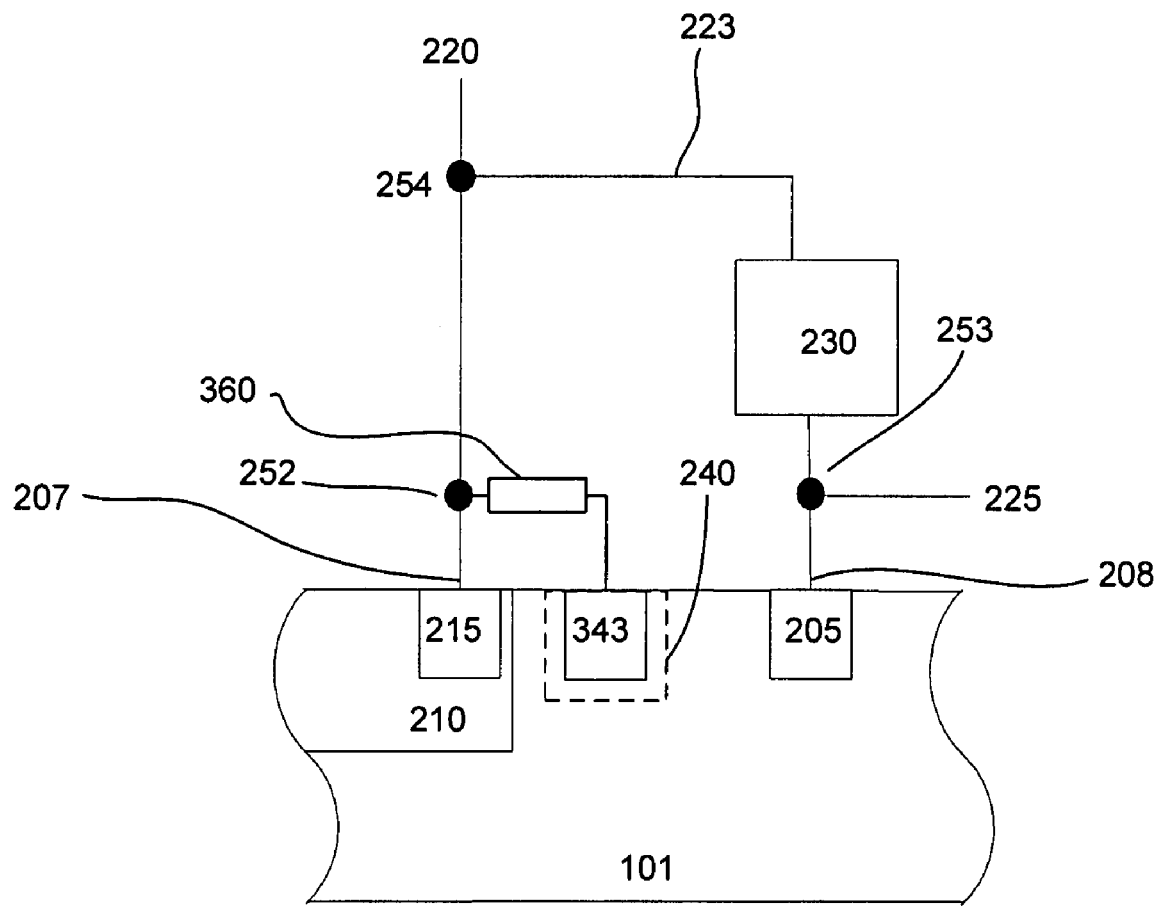

FIGS. 3a-b show implementations of the antenna diode circuit in accordance with different embodiments of the invention. Referring to FIG. 3a, the antenna diode 240 is formed by providing a doped contact region in the doped well. The doped contact region 343 comprises dopants of the second polarity type, opposite to that of the doped well. The doped contact region is coupled to the second circuit terminal. A diode protection circuit 360 is disposed between the doped contact region and the second circuit terminal. In one embodiment, the diode protection circuit 360 comprises at least one EOS protection element which is coupled between junction 253 and the doped contact region.

Alternatively, as shown in FIG. 3b, a doped contact region 343 is provided in the substrate. The doped contact region comprises dopants of the first polarity type. The doped contact region is coupled to the first circuit terminal. A diode protection circuit 360 is disposed between the first circuit terminal and the doped contact region. At least one EOS protection element is coupled between junction 252 and the doped contact region in accordance with one embodiment of the invention. Other configurations of diode circuit path and diode protection circuit(s) are also useful.

Figure 4B:
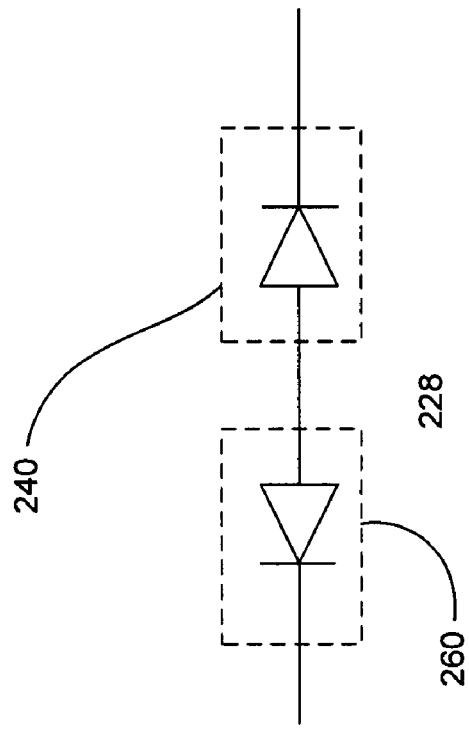
FIGS. 4a-d show diode circuit path in accordance with various embodiments of the invention.
Figure 4A:
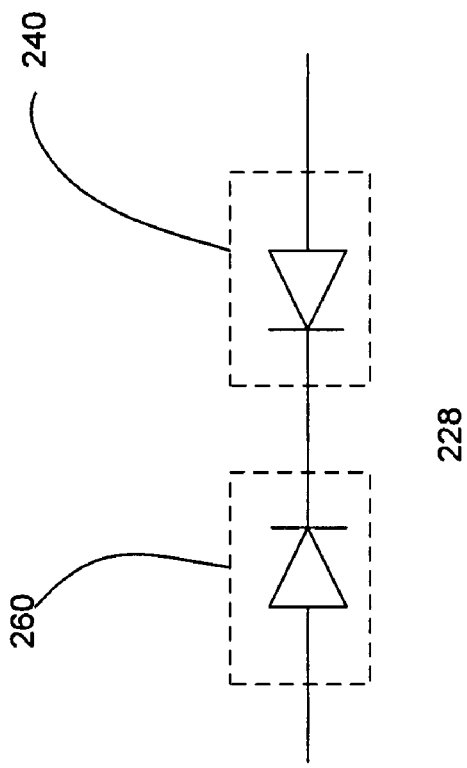

FIGS. 4a-b show diode circuit paths 228 in accordance with different embodiments of the invention. The diode circuit path includes an antenna diode 240 and a diode protection circuit 260. The EOS protection element of the diode protection circuit comprises a protection diode coupled in series with the antenna diode. In one embodiment, a first terminal of the antenna diode is coupled to a first terminal of the protection diode. In one embodiment, the first terminals are of the same type, for example, anode-to-anode or cathode-to-cathode. For example, as shown in FIG. 4a, the diode circuit comprises an anode terminal coupled to the second circuit terminal. The cathode terminal of the antenna diode is coupled to a cathode terminal of the protection diode. Alternatively, an anode terminal of the antenna diode is coupled to an anode terminal of the protection diode, as shown in FIG. 4b. Furthermore, it should be understood that the diode circuit path can include additional EOS protection elements, such as resistors, inductors or a combination thereof. The additional EOS protection elements can be located anywhere in the diode circuit path, for example, between the diodes, on either side of the diode pair, or a combination thereof. Other configurations of EOS protection elements are also useful.

Figure 4C:
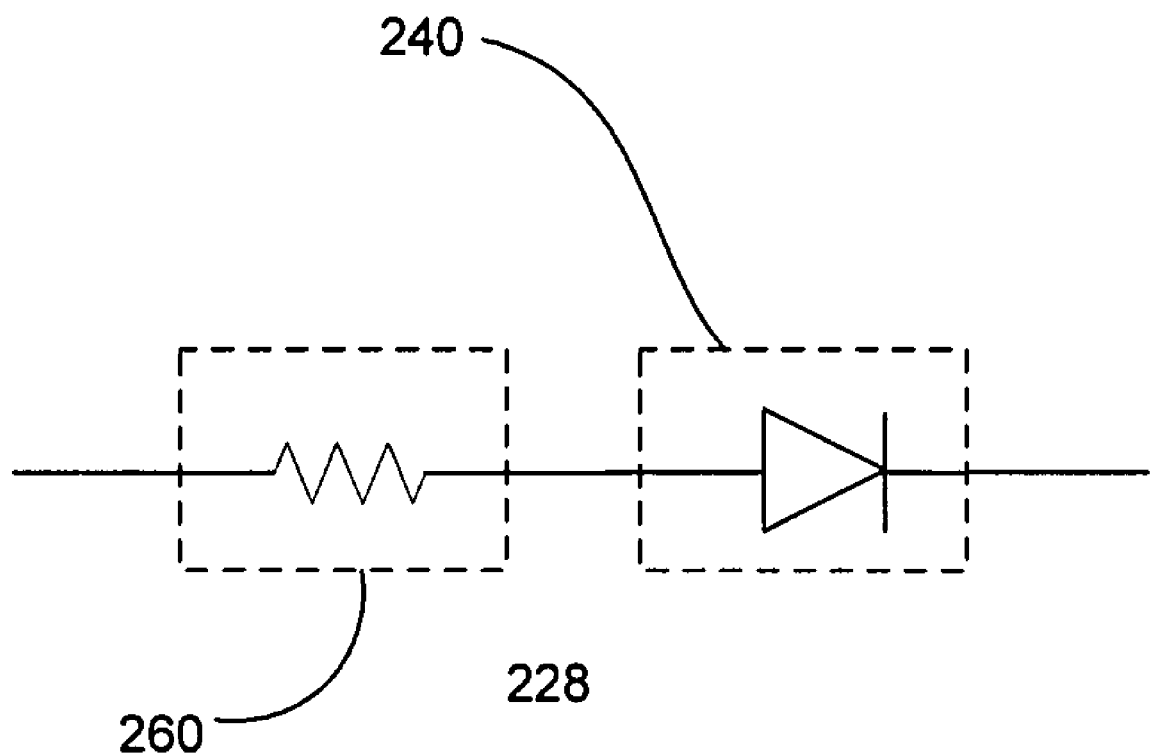
Figure 4D:
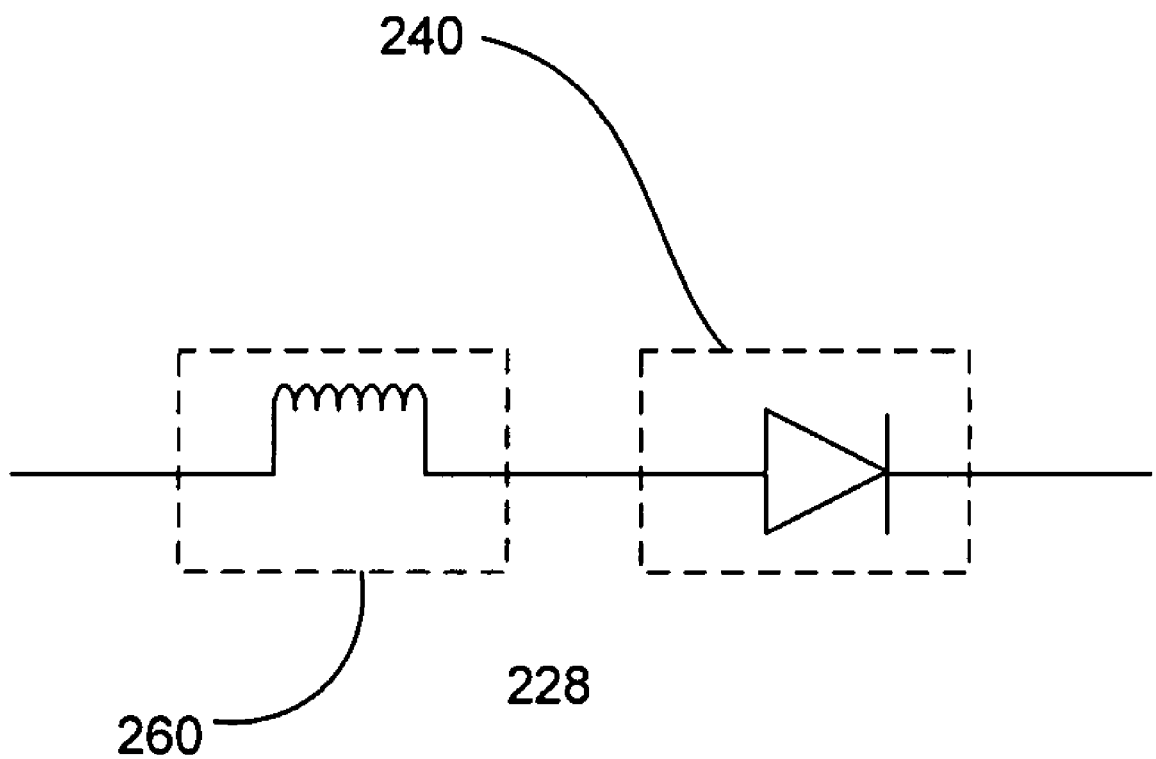

FIG. 4c shows yet another embodiment of the invention, whereby the diode protection circuit comprises an EOS protection element which is a resistor coupled in series with the antenna diode 240. While FIG. 4c shows a resistor, it should be understood that the EOS protection element can be an inductor, as shown in FIG. 4d. Other types of EOS protection elements or a combination of EOS protection elements are also useful.

Figure 5A:
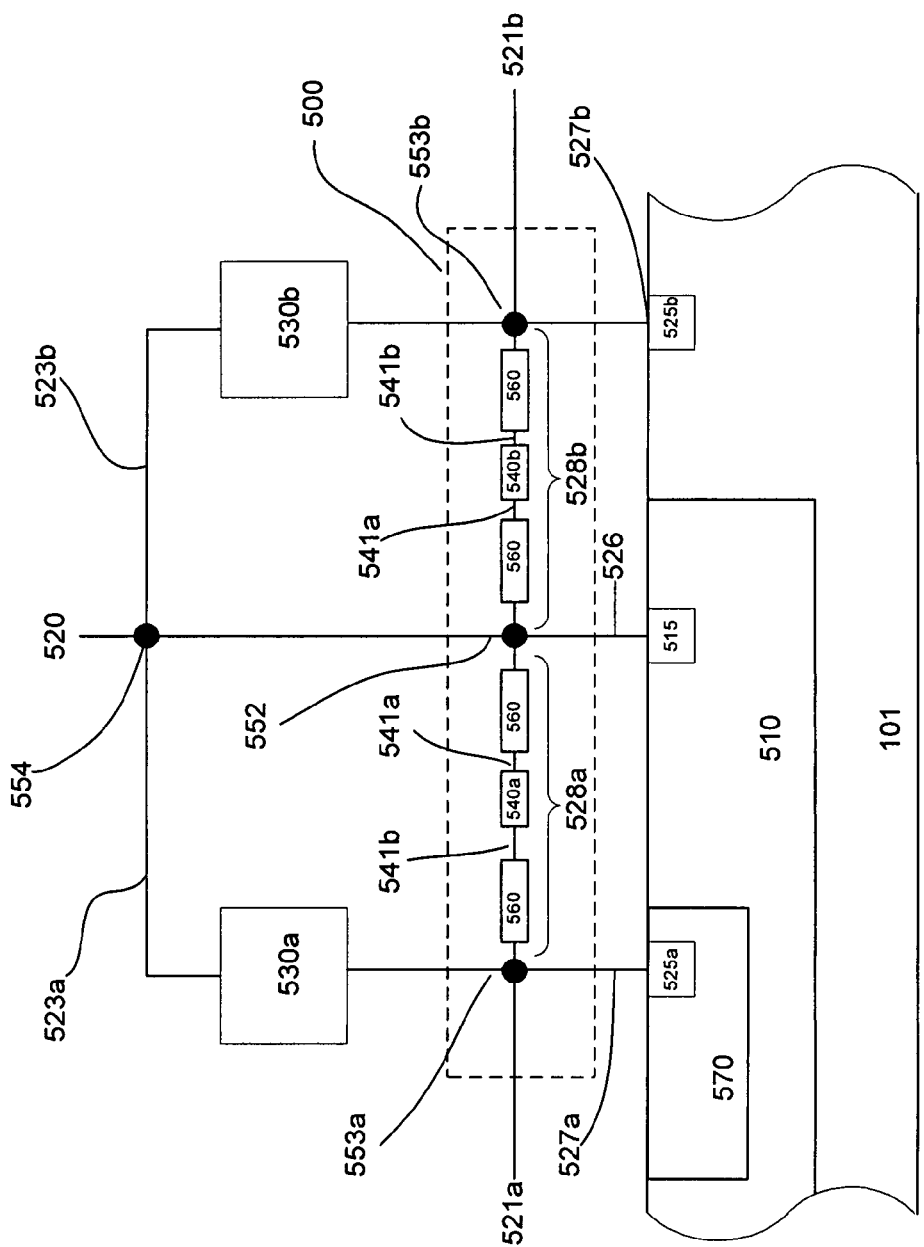
FIGS. 5a-c show block diagrams of antenna diode circuits in accordance with another embodiment of the invention.
Figure 5B:
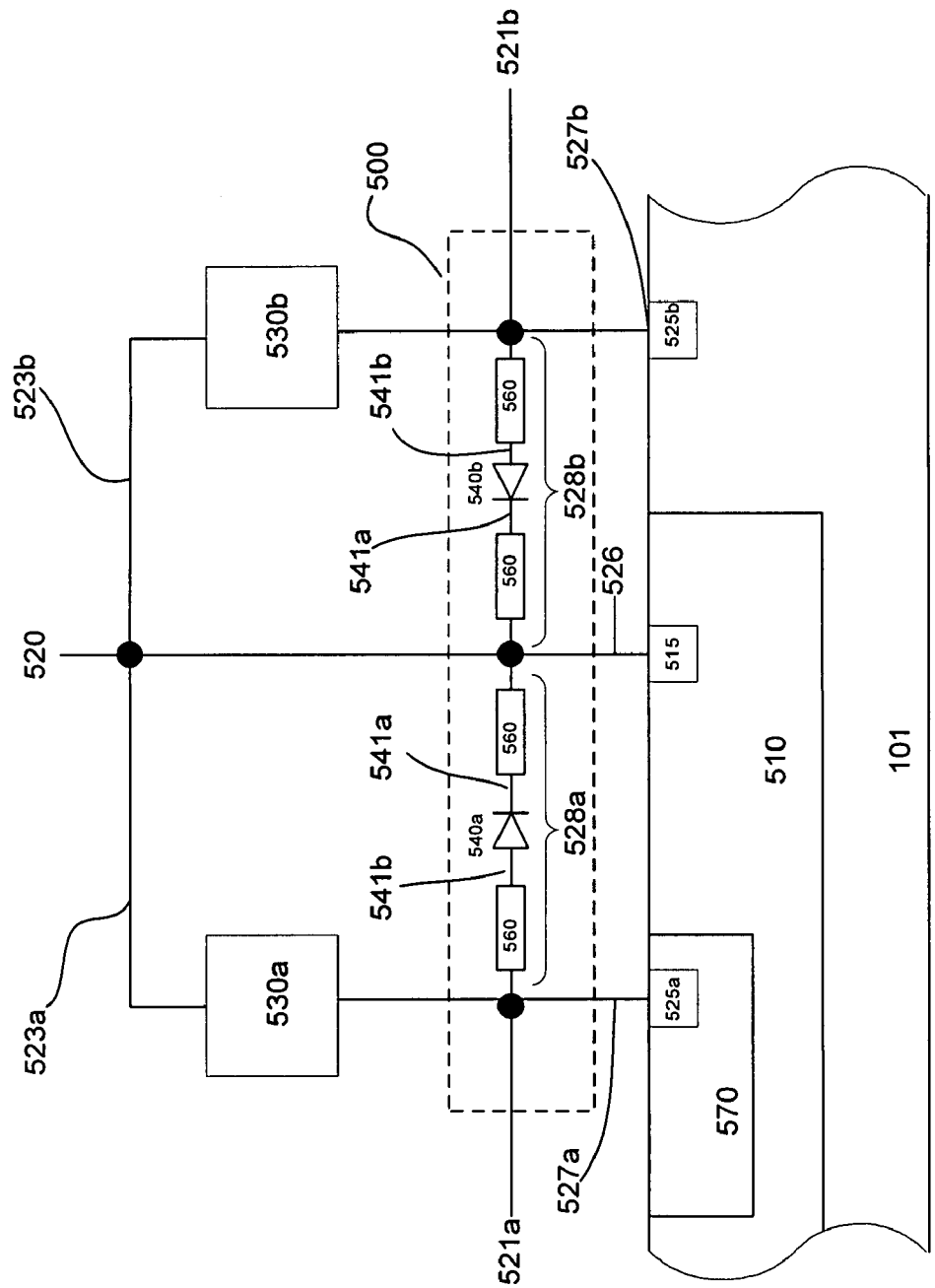
Figure 5C:
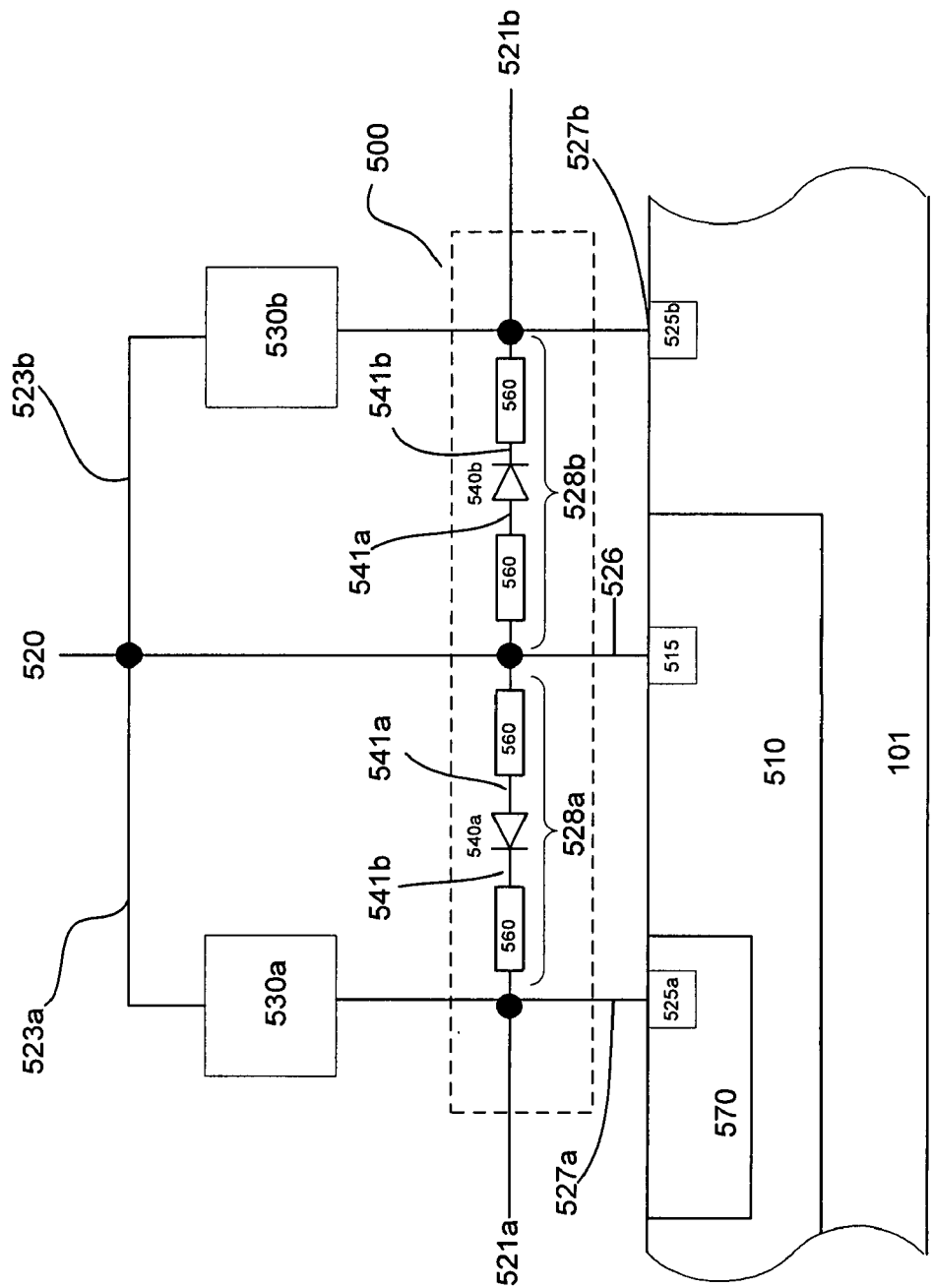

FIGS. 5a-c show a block diagram of an antenna diode circuit 500 in accordance with another embodiment of the invention. The antenna diode circuit is coupled to a substrate 101. The substrate, for example, comprises a semiconductor substrate such as silicon. In one embodiment, the substrate comprises a substrate lightly doped with dopants of a second polarity. Other types of substrates are also useful. A first well 510 is provided in the substrate comprising a first polarity type. A second well 570 of the second polarity type is provided within the first well. In one embodiment, the first polarity comprises n-type dopants while the second polarity comprises p-type dopants, producing a lightly doped p-type substrate having an n-type well with a p-type isolation well therein. Alternatively, the first polarity comprises p-type dopants and the second polarity comprises n-type dopants. Other configurations of doped wells and substrates are also useful.

In one embodiment, the antenna diode circuit comprises first, second and third junctions 552 and 553a-b, forming first and second diode circuit paths 528a-b. In one embodiment, the first diode circuit path is disposed between the first and second junctions and the second diode circuit path is disposed between the first and third junctions. The antenna diode circuit is coupled to the substrate by first, second, and third substrate terminals 526 and 527a-b via heavily doped regions. For example, the first substrate terminal is coupled to the first doped well by a heavily doped region 515 of the first polarity type; the second and third substrate terminals are respectively coupled to the second doped well and substrate by, for example, heavily doped regions 525a-b of the second polarity type. In one embodiment, the first substrate terminal is coupled to the first junction, the second substrate terminal is coupled to the second junction and the third substrate terminal is coupled to the third junction.

First, second and third circuit terminals 520 and 521a-b are provided. The first, second and third circuit terminals are respectively coupled to the first, second and third substrate terminals at junctions 552 and 553a-b. The circuit terminals are coupled to power supplies. In one embodiment, the first circuit terminal is coupled to, for example, a voltage power supply such as $V_{DD}$ while the second and third power supplies are coupled to grounds, such as $V_{GND1}$ and $V_{GND2}$. Other configurations of terminal connections are also useful.

A first over-voltage protection circuit 530a is disposed in a first circuit path 523a between the first and second circuit terminals (e.g., between junctions 554 and 553a). Similarly, a second over-voltage protection circuit 530b is disposed in a second circuit path 523b between the first and third circuit terminals (e.g., between junctions 554 and 553b).

Antenna diodes 540a-b are provided in the diode circuit paths. An antenna diode, for example, comprises a PN junction. Other types of antenna diodes are also useful. First and second diode terminals 541a-b are provided for the antenna diode. In one embodiment, the first diode terminals are coupled to the first junction while the second diode terminals are coupled to respective second and third junctions. In one embodiment, for example in the case where the first polarity comprises n-type and the second polarity comprises p-type, the first terminal of the diode circuit comprises a cathode terminal and the second terminal comprises an anode terminal, as shown in FIG. 5b. Alternatively, the first terminal comprises the anode terminal and the second terminal comprises the cathode terminal, as shown in FIG. 5c. In such case, the first polarity comprises p-type and the second polarity comprises n-type. For example, an n-type doped well 570 is disposed within a p-type doped well 510 formed in an n-type substrate 101. Other configurations of antenna diodes are also useful.

In accordance with one embodiment of the invention, at least one diode protection circuit 560 is provided in series with the antenna diode in the diode circuit paths. Preferably, at least one diode protection circuit is provided in series with the antenna diode in each of the diode circuit path. The diode protection circuit comprises, for example, at least one EOS protection element for reducing or blocking the flow of EOS (e.g., ESD) current through the diode circuit path during, for example, an EOS event. Providing a diode protection circuit with a plurality of EOS protection elements is also useful. Preferably, the EOS protection element or elements reduce or block the flow of EOS current through the diode circuit path during, for example, normal IC operation while allowing charge accumulated in the well during, for example, processing to discharge to the substrate. In one embodiment, the EOS protection elements comprise resistors, inductors, diodes or a combination thereof. Other types of EOS protection elements for reducing or blocking EOS current flow are also useful. Preferably, the diode protection circuit comprises at least a diode as an EOS protection element. The diode protection circuit can be coupled to either the first diode terminal, second diode terminal or both. Other series configurations are also useful. Preferably, the protection circuit arrangements in the different antenna diode circuit paths are the same. However, it is understood that the diode protection circuit arrangement in the different diode circuit paths need not be the same. As described, the antenna diode circuit comprises first and second diode circuit paths. Providing antenna diode circuits with other number of diode circuit paths are also useful.

Figure 6A:
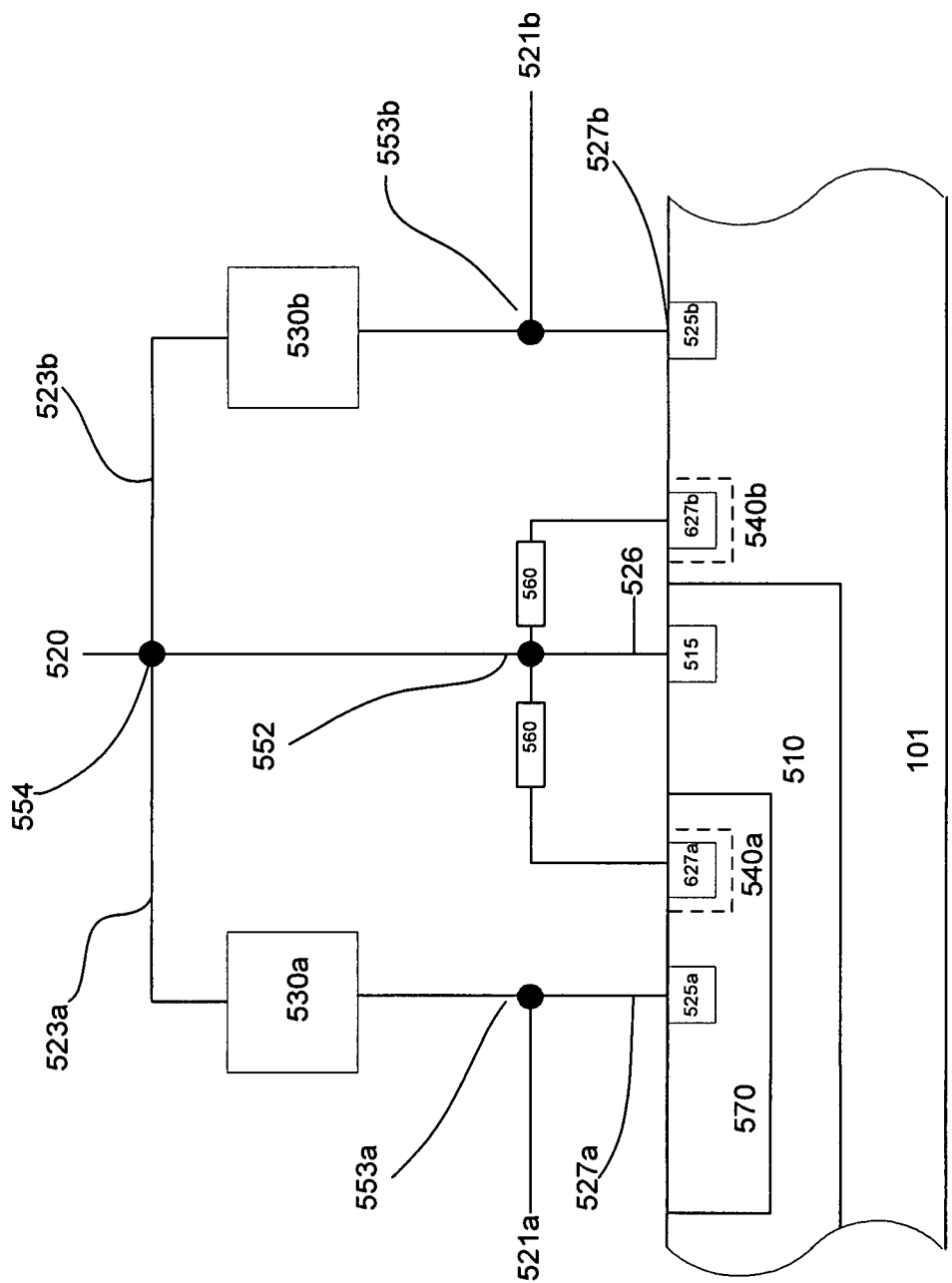
FIGS. 6a-b show implementations of antenna diode circuits in accordance with various embodiments of the invention.
Figure 6B:
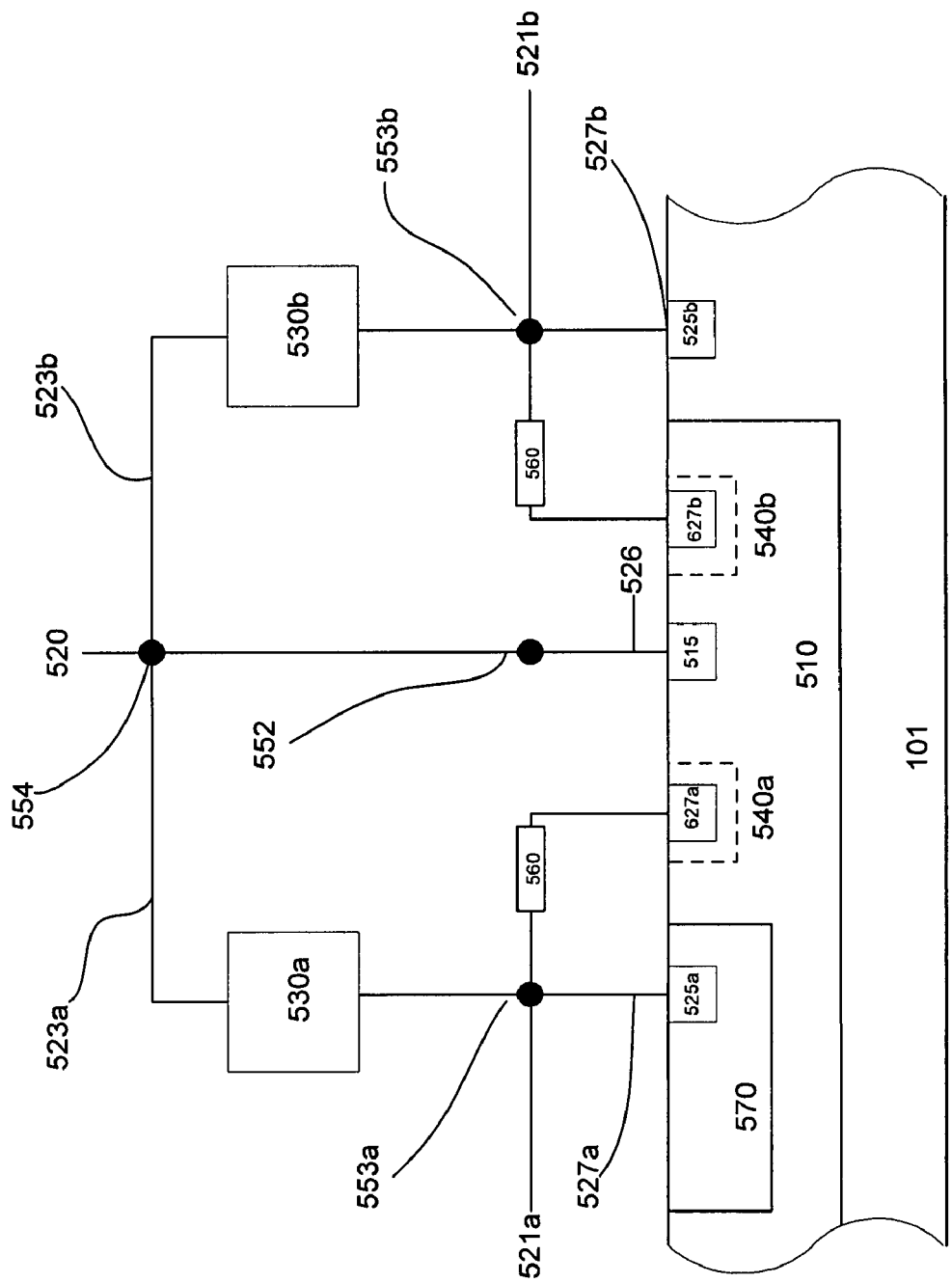

FIGS. 6a-b show implementations of antenna diode circuits in accordance with different embodiments of the invention. The antenna diode circuit includes first and second over-voltage protection circuits 530a-b, as described in FIGS. 5a-c. The first and second diode paths include first and second antenna diodes 540a-b. Referring to FIG. 6a, the first antenna diode 540a is formed by, for example, a heavily doped region 627a on the second well. The heavily doped region comprises the first polarity type dopants, forming a PN junction, with the first terminal coupled to junction 552. The first diode protection circuit 560 is coupled between the first diode terminal and junction 552. The second diode is provided by a heavily doped region 627b having a first polarity. The first terminal is coupled to junction 552. The diode protection circuit 560 is coupled between the junction and the cathode terminal. In one embodiment, the first polarity comprises n-type and the second polarity comprises p-type, resulting in the first diode terminals being cathode terminals. Alternatively, for p-type first polarity and n-type second polarity, the first diode terminals comprise anode terminals.

In another embodiment, as shown in FIG. 6b, the first antenna diode 540a can be formed by a first heavily doped region 627a in the first well. The first heavily doped region comprises the second polarity type dopants, forming a PN junction of the diode with the second diode terminal coupled to junction 553a. The first diode protection circuit 560 is coupled between the second diode terminal and junction 553a. A second heavily doped region 627b on the substrate having the second polarity is also provided in the first doped well to form the second antenna diode 540b. The doped region is coupled to junction 553b. A diode protection circuit 560 is coupled between junction 553b and the second terminal at the heavily doped region 627b.

In one embodiment, the first polarity type comprises n-type and second polarity type comprises p-type. The first terminal of the diode comprises a cathode terminal and the second terminal comprises an anode terminal. Alternatively, where the first polarity comprises p-type and the second polarity comprises n-type, the first diode terminal is an anode terminal and the second terminal is a cathode terminal. For the case where a diode protection circuit comprises a protection diode, like diode terminals of the antenna diode and protection diode are coupled together, as described in FIGS. 4a-b.

Figure 7A:
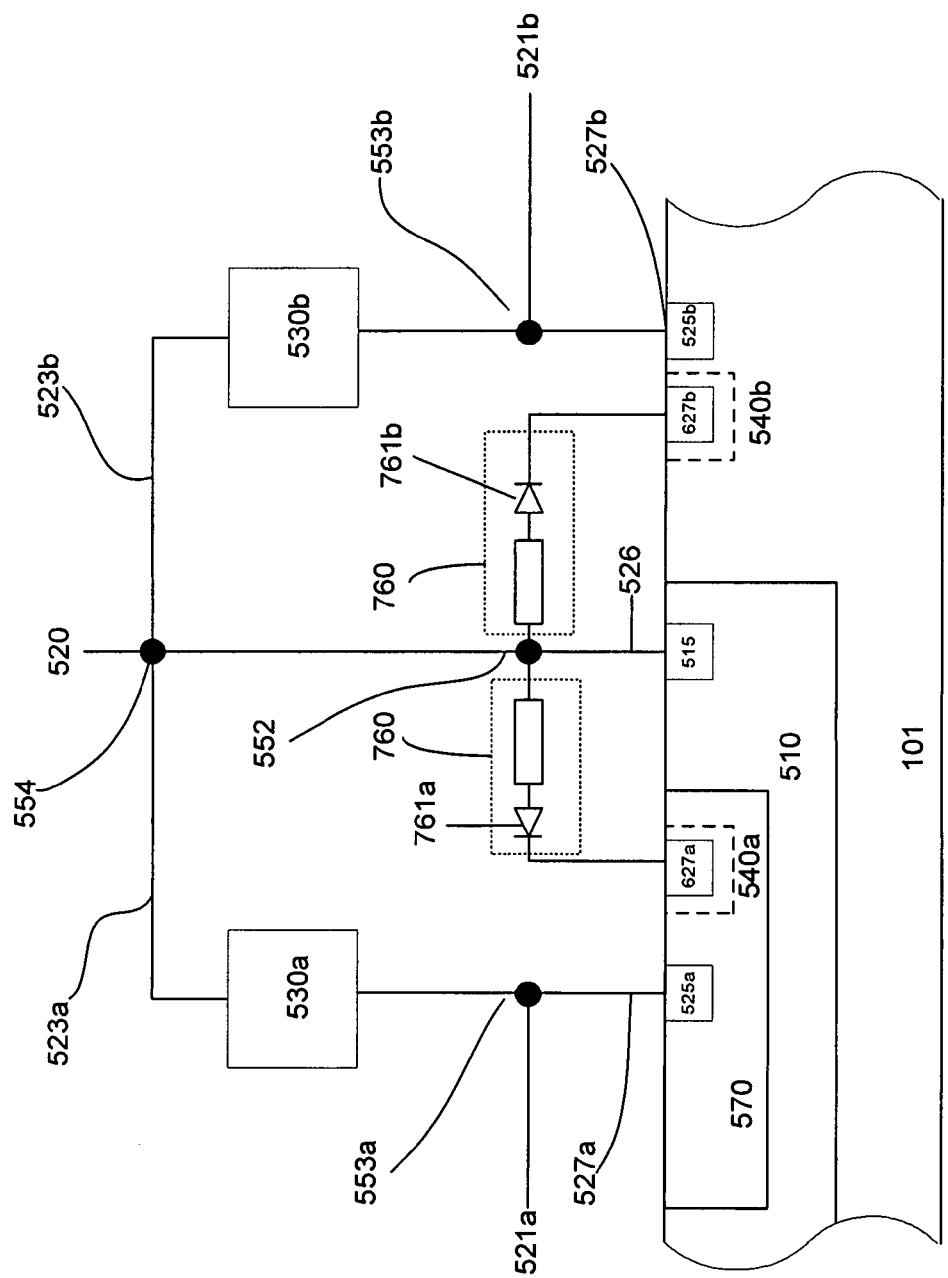
FIGS. 7a-b show implementations of antenna diode circuits in accordance with alternative embodiments of the invention.
Figure 7B:
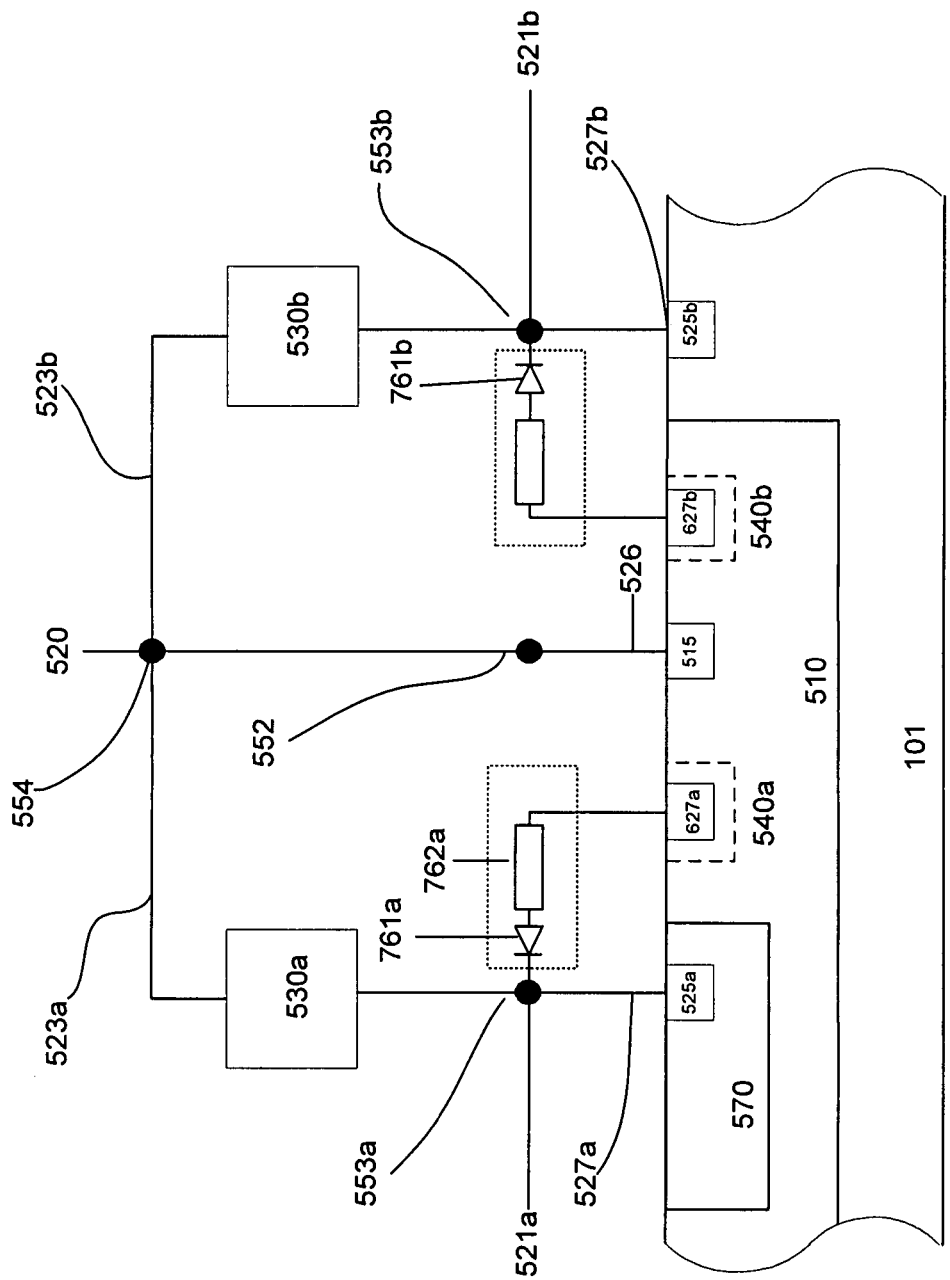

FIGS. 7a-b show implementations of the antenna diode circuit in accordance with alternative embodiments of the invention. The implementations are similar to those described in FIGS. 6a-b except that a diode protection circuit 760 comprises a plurality of EOS protection elements which includes at least one protection diode (e.g., 761a-b). Preferably, the protection circuits are the same. Providing protection circuits which are different can also be useful. As shown, the first polarity comprises n-type and the second polarity comprises p-type. Alternatively, the first polarity can be p-type and the second polarity can be n-type.

Referring to FIG. 7a, the protection diode 761a of the first diode protection circuit has its cathode coupled to the cathode of the first antenna diode at the first heavily doped region 627a. Similarly, the protection diode 761b of the second diode protection circuit has its cathode coupled to the cathode terminal of the second antenna diode at the second heavily doped region 627b. The other EOS protection elements are coupled between the anode terminals and junction 552. Alternatively, as shown in FIG. 7b, the cathode terminal of the first protection diode 761a is coupled to junction 553a while the anode terminal is coupled to an anode terminal of the first antenna diode with an EOS protection element 762a therebetween. The second protection circuit is similarly coupled to the second antenna diode and junction 553b.

The above invention may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

What is claimed is:

1. An integrated circuit (IC) comprising:
    an antenna diode circuit path having first and second junctions, the first junction is coupled to a circuit element and the second junction is coupled to a first region on a substrate, wherein the diode circuit path provides a path for dissipating statically stored charge in the circuit element accumulated during processing to the substrate;
    an antenna diode disposed in the diode circuit path wherein the antenna diode is configured in reverse bias between the circuit element and the substrate; and
    a diode protection circuit disposed in the diode circuit path in series with the antenna diode to reduce electrical overstress (EOS) current flowing through the antenna diode circuit path.

2. The IC of claim 1 further comprises:
    a first circuit terminal coupled to the circuit element, the first circuit terminal coupled to a first power rail having a first potential;
    a second circuit terminal coupled to the first region on the substrate, the second circuit terminal coupled to a second power rail having a second potential; and
    an over-voltage protection circuit disposed between the first and second circuit terminals.

3. The IC of claim 2 wherein:
    the first region on the substrate comprises the substrate, wherein the substrate comprises a second polarity type and the circuit element comprises a doped well on the substrate, the doped well comprises a first polarity type; or
    the first region on the substrate comprises a first doped well of the second polarity type disposed within the circuit element comprising a second doped well of the first polarity type, the doped wells are disposed on the substrate of the second polarity type.

4. The IC of claim 3 wherein the first polarity type comprises n-type and the second polarity type comprises p-type.

5. The IC of claim 4 wherein the first potential comprises a higher potential relative to the second potential.

6. The IC of claim 4 wherein the first potential comprises $V_{DD}$ and the second potential comprises $V_{GND}$.

7. The IC of claim 3 wherein the first polarity type comprises p-type and the second polarity type comprises n-type.

8. The IC of claim 7 wherein the first potential comprises a lower potential relative to the second potential.

9. The IC of claim 7 wherein the second potential comprises $V_{DD}$ and the first potential comprises $V_{GND}$.

10. The IC of claim 1 further comprises:
    a first circuit terminal coupled to the circuit element, the first circuit terminal coupled to a first power rail having a first potential;
    a second circuit terminal coupled to the first region on the substrate, the second circuit terminal coupled to a second power rail having a second potential;
    wherein the antenna diode disposed in the diode circuit path is configured to be in reverse biased between the circuit element to prevent current flow between the first and second terminals during normal operation.

11. The IC of claim 10 wherein the first potential comprises a higher potential than the second potential.

12. The IC of claim 10 further comprises an over-voltage protection circuit disposed between the first and second circuit terminals.

13. The IC of claim 12 wherein the first potential comprises a higher potential than the second potential.

14. The IC of claim 1 wherein the antenna diode comprises first and second diode terminals, wherein the diode protection circuit is coupled to one of the diode terminals in series with the antenna diode in the diode circuit path.

15. The IC of claim 14 wherein the diode protection circuit comprises at least one EOS protection element.

16. The IC of claim 15 wherein the EOS protection element can be selected from a group comprising resistor, inductor, diode or a combination thereof.

17. The IC of claim 16 wherein the EOS protection element of the diode protection circuit comprises a protection diode.

18. The IC of claim 17 wherein one terminal of the protection diode is coupled to one of the terminals of the antenna diode, wherein the terminals are of the same type.

19. The IC of claim 1 further comprises:
    a first circuit terminal coupled to the circuit element,
    a second circuit terminal coupled to the first region on the substrate,
    wherein the antenna diode disposed in the diode circuit path is configured to be in reverse biased between the circuit element and the first region to prevent current flow between the first and second terminals during normal operation.

20. A method of designing a device comprising:
    providing in a device design a diode circuit path having first and second junctions, wherein the first junction is coupled to a device element and the second junction is coupled to a region on a substrate, wherein the diode circuit path provides a path for dissipating statically stored charge in the device element accumulated during processing to form the device;
    providing an antenna diode disposed in the diode circuit path wherein the antenna diode is configured in reverse bias between the device element and region on the substrate; and
    providing a diode protection circuit disposed in the diode circuit path in series with the antenna diode to reduce EOS current flowing through the antenna diode circuit path during normal operation of the device.

21. A method for reducing static discharge damage comprising:
    providing a substrate with a circuit element;
    forming an antenna diode in a diode circuit path between first and second junctions, the first junction coupled to the circuit element and the second junction coupled to the substrate to provide a path to discharge static charge accumulated on the circuit element during processing; and
    providing at least one diode protection circuit in the diode circuit path in series with the antenna diode to reduce EOS current flowing through the diode circuit path.

* * * * *